United States Patent [19]

Hirohashi et al.

[11] Patent Number: 4,574,390

[45] Date of Patent: Mar. 4, 1986

[54] NOISE REDUCTION FOR STEREOPHONIC FM SIGNALS BY HIGH-SPEED SAMPLING AND LINEAR INTERPOLATION

[75] Inventors: Kazutoshi Hirohashi, Yokohama; Yukinobu Ishigaki, Tokyo, both of Japan

[73] Assignee: Victor Company of Japan, Limited, Yokohama, Japan

[21] Appl. No.: 594,683

[22] Filed: Mar. 26, 1984

[30] Foreign Application Priority Data

Mar. 26, 1983 [JP] Japan ................................. 58-50825
Mar. 31, 1983 [JP] Japan ................................. 58-56430

[51] Int. Cl.$^4$ .............................................. H04H 5/00
[52] U.S. Cl. ..................... 381/13; 328/165; 455/223; 330/149
[58] Field of Search ..................... 381/13, 94; 330/149; 328/151, 163, 165; 375/104; 455/50, 63, 222, 223, 303, 304, 283, 296

[56] References Cited

U.S. PATENT DOCUMENTS

| | | | |
|---|---|---|---|
| 3,947,636 | 3/1976 | Edgar ................................... | 381/94 |
| 4,246,441 | 1/1981 | Sugai et al. ........................... | 381/13 |
| 4,306,112 | 12/1981 | Ueno ..................................... | 381/13 |
| 4,311,963 | 1/1982 | Watanabe et al. ................... | 375/104 |
| 4,419,541 | 12/1983 | Kishi et al. ............................. | 381/13 |
| 4,430,754 | 2/1984 | Ishigaki ................................. | 381/94 |
| 4,480,335 | 10/1984 | Kishi ..................................... | 381/13 |
| 4,491,957 | 1/1985 | Kamalski ............................. | 381/13 |

Primary Examiner—Forester W. Isen
Attorney, Agent, or Firm—Lowe, King, Price & Becker

[57] ABSTRACT

In a noise reduction circuit for reception of stereophonic FM signals in which the demodulated signal is chopped at twice the pilot frequency for separation between left- and right-channel signals, the demodulated signal is sampled by a first sample-and-hold circuit in response to the output of the noise detector to store that portion of the signal which appeared immediately prior to the occurrence of an impulse noise. The demodulated signal is also sampled by a second sample-and-hold circuit at a frequency twice the pilot frequency to eliminate a noise which might arise due to the chopping of the demodulated signal. A signal is derived from the outputs of the first and second sample-and-hold circuits that indicates the slope ratio of the demodulated signal at the moment that occurred immediately prior to the impulse noise. The slope ratio signal is applied to a linear integrator to generate a compensating voltage which is summed with the signal sampled by the first sample-and-hold circuit at the level which occurred immediately prior to the occurrence of the impulse noise.

18 Claims, 6 Drawing Figures

NOISE REDUCTION FOR STEREOPHONIC FM SIGNALS BY HIGH-SPEED SAMPLING AND LINEAR INTERPOLATION

RELATED COPENDING APPLICATION

The present application is related to Copending U.S. patent application No. 517,985, now U.S. Pat. No. 4,517,518, filed July 29, 1983 invented by Y. Ishigaki, assigned to the same assignee as the present invention, and titled "Circuit Arrangement for Reconstructing Noise-Affected Signals".

BACKGROUND OF THE INVENTION

The present invention relates generally to noise reduction, and in particular to a noise reduction circuit which eliminates impulse noise that occurs in broadcast stereophonic composite FM signals using a linear interpolation technique and eliminates noise that occurs as a result of switched separation of received composite FM signal into left- and right-channel signals.

One method currently available for suppressing impulse noise that contaminates audio signals involves reducing the transmission gain or shutting off the transmission path of the signal as long as the noise is present. Another method involves detecting the amplitude of the desired signal on the rising edge of an impulse noise and retaining the detected amplitude in the presence of the impulse noise. While these methods are effective in suppressing impulse noise, the noise-affected portion of the signal is not reconstructed, resulting in unnatural sound. To overcome this problem modern digital audio systems utilize linear interpolation technique to predict the original waveform of the noise-affected portion for the noise-affected portion of the signal. This type of systems requires complicated, expensive circuitry, not suitable for moderate cost equipments.

The aforesaid Copending U.S. Application discloses an impulse noise reduction circuit for FM signals. Received FM signal is demodulated and passed to a first sample-and-hold circuit which tracks the waveform of the signal when no impulse noise is present and samples it in response to a noise-triggered sampling pulse so that the signal is held at the level that occurs immediately prior to the noise. The output of the first sample-and-hold circuit is applied to a feedback circuit which includes a differentiator. The slope ratio of the demodulated signal which occurs immediately prior to the noise is detected by the differentiator whose output is sampled by a second sample-and-hold circuit in response to the sampling pulse, generating a signal as an indication of the slope ratio of the noise-affected portion of the demodulated signal. This signal drives a voltage-controlled bidirectional constant current source to linearly vary the voltage sampled by the first sample-and-hold circuit.

However, one disadvantage inherent in the differentiator is that it tends to accentuate a high frequency component of an input applied thereto since its output is proportional to the rate at which the input signal changes, and the accentuated high frequency component is sampled, causing a distortion of the correction signal which is used to interpolate the noise-affected portion of the signal. This is particularly severe when the noise reduction circuit is employed in an FM receiver adapted to receive stereophonic composite FM signal since the receiver provides switching of the demodulated signal into left- and right-channel signals at a frequency twice the frequency of the 19-kHz pilot signal and this switching presents a high frequency signal to the differentiator.

Another approach that proves useful for suppressing an impulse noise in stereophonic FM signals makes use of a sample-and-hold circuit connected between the output of a demodulator and the input to a separation circuit by which the demodulated signal is switched between left- and right-channel deemphasis circuits. An impulse noise detector is connected to the output of the demodulator to generate a sampling pulse with which the sample-and-hold circuit samples the signal immediately prior to the occurrence of the noise and holds it in the presence of the noise. However, the switching action of the separation circuit chops the sampled signal and produces a noise in one of the deemphasis circuits.

SUMMARY OF THE INVENTION

Therefore, the primary object of the invention is to provide an inexpensive impulse noise reduction circuit for FM receivers using a linear interpolation technique which is immune to a noise resulting from the 38 kHz component arising from the FM receiver which is twice the pilot signal frequency.

The noise reduction circuit of the present invention is intended for use with an FM receiver adapted to receive a composite stereophonic FM signal. The composite FM signal comprises a sum of left and right channel signals on a main channel, a difference between left and right channel signals on a subcarrier channel, a pilot signal and the sidebands of a suppressed subcarrier which is twice the frequency of the pilot signal and modulated by the difference, the receiver including a demodulator for demodulating the composite FM signal. The noise reduction circuit comprises a noise detector for detecting an impulse noise in the demodulated signal.

According to a broader aspect of the invention, the demodulated signal is sampled by a first sample-and-hold means in response to the output of the noise detector to store that portion of the signal which appeared immediately prior to the occurrence of the impulse noise. The demodulated signal is also sampled by a second sample-and-hold means at a frequency twice the frequency of the pilot signal to eliminate a noise which might arise due to the chopping of the demodulated signal at twice the pilot frequency. A signal is derived from the outputs of the first and second sample-and-hold means which indicates the slope ratio of the demodulated signal at the moment immediately prior to the impulse noise. The slope ratio signal is applied to a linear integrator to generate a compensating voltage which is summed with the signal sampled by the first sample-and-hold means and maintained at the level which occurred immediately prior to the occurrence of the noise.

In accordance with a first specific embodiment of the present invention, the noise reduction circuit comprises a first sampling pulse generator for generating a first sampling pulse in response to an impulse noise and a second sampling pulse generator for generating a pair of trains of second and third sampling pulses at a frequency twice the frequency of the pilot signal, there being a predetermined phase difference between the second and third sampling pulses. A first sample-and-hold circuit is provided for tracking the waveform of one of the left and right channel signals for application to an output terminal and operating in a sample-and-hold mode in response to the first sampling pulse for sampling a voltage which occurs immediately prior to the occurrence of the noise for application to the output terminal. A second sample-and-hold circuit is connected to the output of the first sample-and-hold circuit for operating in a sample-and-hold mode in response to the second sampling pulse. The difference between the outputs of the first and second sample-and-hold circuits is detected by a subtractor and fed to a third sample-and-hold circuit which operates in a sample-and-hold mode in response to the third sampling pulse. A fourth sample-and-hold circuit is connected to the output of the third sample-and-hold circuit for operating in a sample-and-hold mode in response to the first sampling pulse to generate a signal representing the slope ratio of the channel signal at the time the voltage is sampled by the first sample-and-hold circuit. A charge-and-discharge circuit is responsive to the slope ratio signal for linearly increasing and decreasing the sampled voltage, thereby linearly interpolating the noise-affected portion of the desired signal.

In accordance with a second specific embodiment of the present invention, the noise reduction circuit comprises a first pair of sample-and-holds for sampling the demodulated signal at a frequency twice the frequency of the pilot signal. A second sample-and-hold circuit is responsive to the output of the noise detector for sampling the outputs of the first sample-and-hold circuits immediately prior to the occurrence of a noise and a third sample-and-hold circuit is responsive to the noise detector for sampling the outputs of the first sample-and-hold circuits immediately following the termination of the noise. The difference between the outputs of the second and third sample-and-hold circuits is detected as an indication of the slope ratio of the signal sampled by the second sample-and-hold circuit and fed to a linear integrator for linearly integrating the difference to generate a linearly varying signal which is combined with with the output of the second sample-and-hold circuit.

BRIEF DESCRIPTION OF THE DRAWINGS

The present invention will be described in further detail with reference to the accompanying drawings, in which.

DETAILED DESCRIPTION

Figure 1:
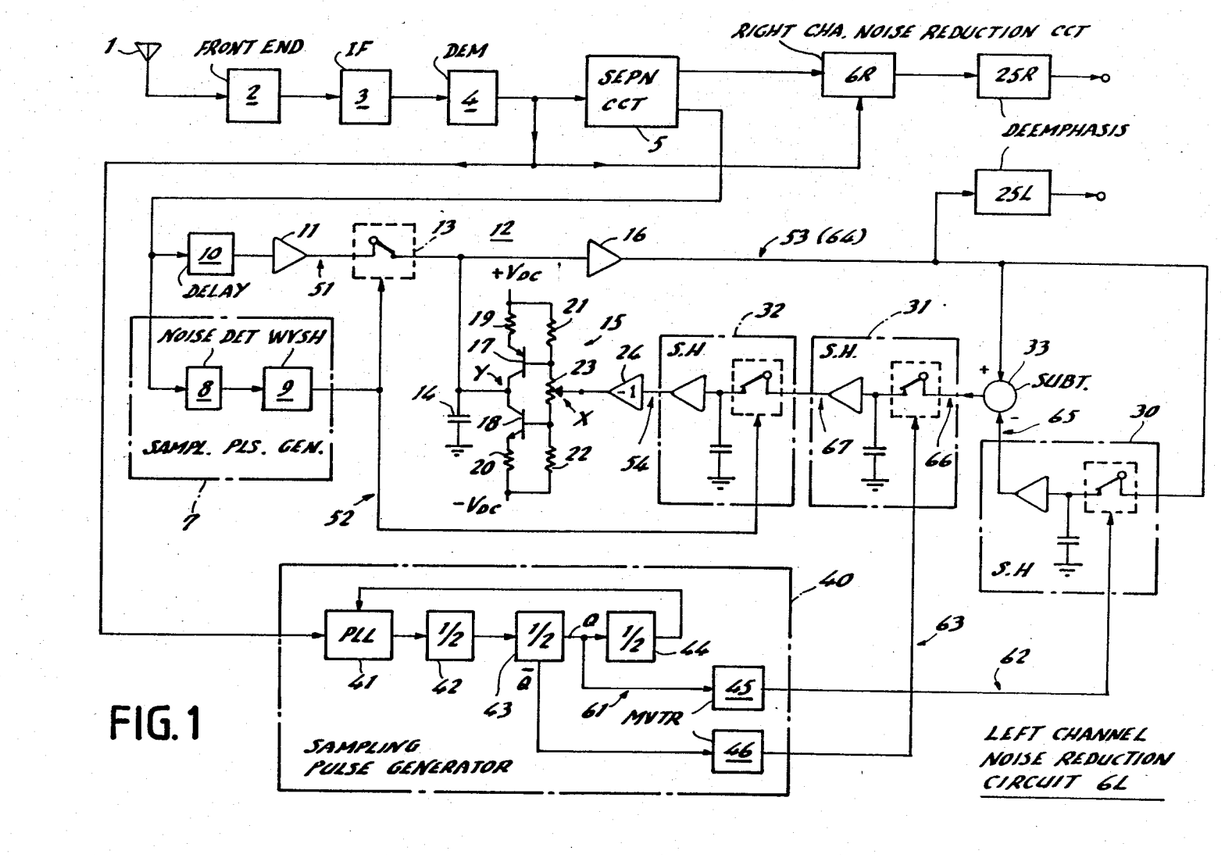
FIG. 1 is a block diagram of a first embodiment of the present invention.

Referring now to FIG. 1, there is shown a noise reduction circuit according to a first embodiment of the present invention incorporated in an FM (frequency-modulated) radio receiver adapted to receive a broadcast stereophonic FM signal which is a composite signal comprising the L (left)+R (right) main channel and the L-R subcarrier channel and which also transmits a 19 kHz pilot signal and the sidebands of a suppressed 38 kHz subcarrier which is amplitude-modulated by L-R information. Preemphasis is also provided before the left and right channels are added for main channel information.

The broadcast FM stereo signal is intercepted by an antenna 1, fed through the front end 2 to an IF section 3 and applied to a demodulator 4. The output of the demodulator 4 is applied to a separation circuit 5 which detects the 19-kHz pilot carrier and chops the signal at the 38-kHz subcarrier frequency into left and right channels and applies the individual components to a left-channel noise reduction circuit 6L and a right-channel noise reduction circuit 6R, respectively. For the sake of simplicity, the left-channel noise reduction circuit is only illustrated in detail.

The noise reduction circuit 6L includes a first sampling pulse generator 7 formed by a noise detector 8 and a waveshaper 9. The noise detector 8 provides detection of noise impulses having a duration of about 40 microseconds introduced to the received signal from external sources such as spark-ignition engines and the waveshaper 9 generates a sharply defined pulse in response to the noise detector 8. The output of the waveshaper 9 is used as a first sampling pulse and applied to sample-and-hold circuits to be described.

A delay circuit 10 introduces a time delay to the FM signal to compensate for the time lapse that is involved in the sampling pulse generator 7 for generating its output pulse so that it is time-coincident with the noise contained in the output of the delay circuit 10. The delayed FM signal is fed through a buffer amplifier 11 having a high output impedance to a sample-and-hold circuit 12. The sample-and-hold circuit 12 comprises an electronic switch 13, a capacitor 14, a bidirectional, constant current charging and discharging circuit 15 and a buffer amplifier 16 having a high input impedance. The switch 13 is normally closed and connected in a signal transmission path through the amplifier 16 to the output of the noise reduction circuit 6L to which is connected a left-channel deemphasis circuit 25L having a characteristic that is complementary to the preemphasis characteristic with which the transmitted signal is accentuated. The capacitor 14 has its one end connected to a junction between the switch 13 and amplifier 16 and the other end connected to ground, whereby it charges through switch 13 to develop a voltage which follows the waveform the FM signal.

The charging and discharging circuit 15 is made up of a pair of transistors 17 and 18 of opposite conductivity types with their collectors being coupled together to the capacitor 14. The transistors 17 and 18 have their emitters connected respectively by resistors 19 and 20 to positive and negative voltage supplies $+V_{DC}$ and $-V_{DC}$, respectively, and biased by voltages developed at junctions of a series connection of resistors 21 and 22 and a potentiometer 23 whose tap point is driven by output signals from a unity gain inverting amplifier 24. The potentiometer 23 is so adjusted that for a zero-volt setting at a node X at the tap point thereof a corresponding zero volt potential appears at a node Y between the collectors of transistors 17 and 18. The node Y provides a high impedance to the capacitor 14 so that the charging and discharging circuit 15 does not affect the capacitor 14 during tracking mode in which it develops a voltage following the waveform of the FM signal.

In response to a sampling pulse from the sampling pulse generator 7, the switch 13 opens to cut off the transmission path and the potential of the FM signal at the instant immediately prior to the occurrence of a noise impulse is stored on capacitor 14. During this hold mode, the charging and discharging circuit 15 operates as follows. Assume a positive potential is applied to the node X the transistor 17 is rendered more conductive than is transistor 18 and supplies more current to the node Y than the current drained therefrom by transistor 18 and the node Y is driven to a positive potential equal to the potential developed at node X. The capacitor 14 is thus charged linearly at a rate proportional to the amplitude of the positive potential. A negative input potential, on the other hand, renders the transistor 18 more conductive than transistor 17 to drain more current from the node Y than the current supplied thereto through transistor 17, so that the node Y is driven to a negative potential equal to the potential at node X. The capacitor 15 is thus discharged linearly at a rate proportional to the amplitude of the negative potential.

The input signal to the charging and discharging circuit 15 is derived through a feedback circuit comprising sample-and-hold circuits 30, 31 and 32 of identical construction and a subtractor 33. The sample-and-hold circuits 30 and 31 are sampled in response to sampling pulses which occurs at 38 kHz with a phase difference of 180° therebetween. The input signal to the sample-and-hold 30 is derived from the output of buffer amplifier 16 and feeds a sampled output to the negative input of the subtractor 33 to the positive input of which is applied the output of the buffer amplifier 16. The sample-and-hold circuit 31 takes its input from the output of subtractor 33 and feeds a sampled output to the sample-and-hold circuit 32 which is sampled by the first sampling pulse generator 7 and drives the unity gain inverting amplifier 24 of the charging and discharging circuit 15 during the hold mode in which impulse noise is present.

The sampling pulses applied to the sample-and-hold circuit 30 and 31 are developed in a second sampling pulse generator 40. This sampling pulse generator takes its input from the output of the demodulator 4 and applies to a phase-locked loop 41 which is connected in series with divide-by-2 counters or flip-flops 42, 43 and 44. The phase-locked loop 41 has a voltage-controlled oscillator which is controlled by a phase difference between the 19-kHz pilot carrier and the output of flip-flop 44 which is also at 19 kHz. Due to the feedback loop, the output of the phase-locked loop 41 is 152 kHz and the true and complementary outputs of the flip-flop 43 is at the switching frequency of 38 kHz. Monostable multivibrators 45 and 46 are connected respectively to the true and complementary outputs of flip-flop 43 to generate short-duration sampling pulses spaced 180° apart for application to the sample-and-hold circuits 30 and 31, respectively.

The operation of the noise reduction circuit 6L will now be described with reference to various waveforms shown in FIGS. 2 and 3.

Figure 2:
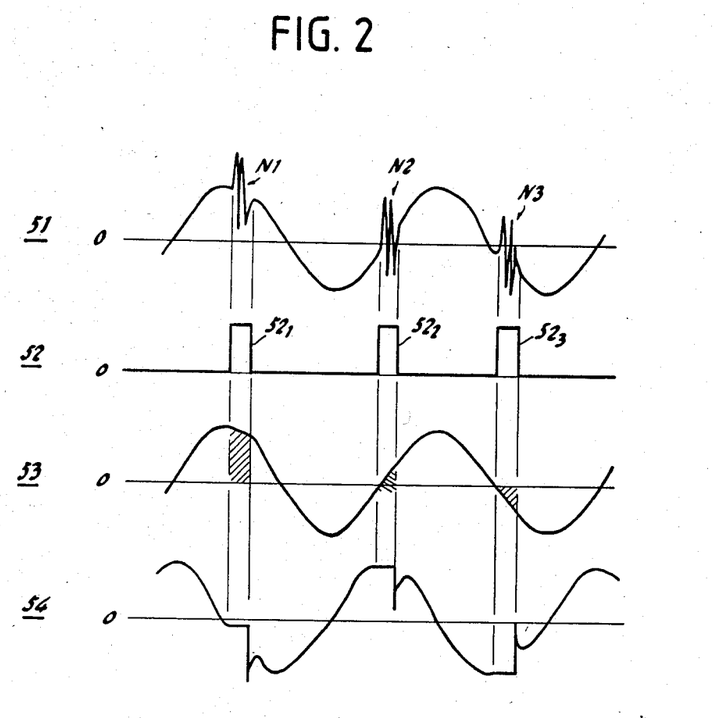
FIG. 2 is a waveform diagram associated with the first embodiment.

The waveform shown at 51 in FIG. 2 is a representation of a portion of the received FM signal having burst noises N1, N2 and N3 which occur at different slopes of the waveform. For purposes of convenience, the waveform is shown as a sinusoidal wave. In response to the noises N1-N3, sampling pulses $52_1$-$52_3$ are generated by the first sampling pulse generator 7 which are substantially time-coincident with the corresponding noises.

The sample-and-hold circuit 12 normally operates in a tracking mode so that the capacitor 14 develops a waveform 53 which tracks the sinusoidal waveform of the input signal. Sample-and-hold circuit 12 then switches a hold mode in response to the sampling pulse when noise occurs in the received signal, whereby the signal transmission path is cut off and the potential at the instant which occurred immediately prior to the occurrence of the noise is stored on capacitor 14. Since the signal continues in the presence of the impulse noise, the potential stored on capacitor 14 must be compensated for by a slope ratio signal derived in a manner as will be given below.

Figure 3:
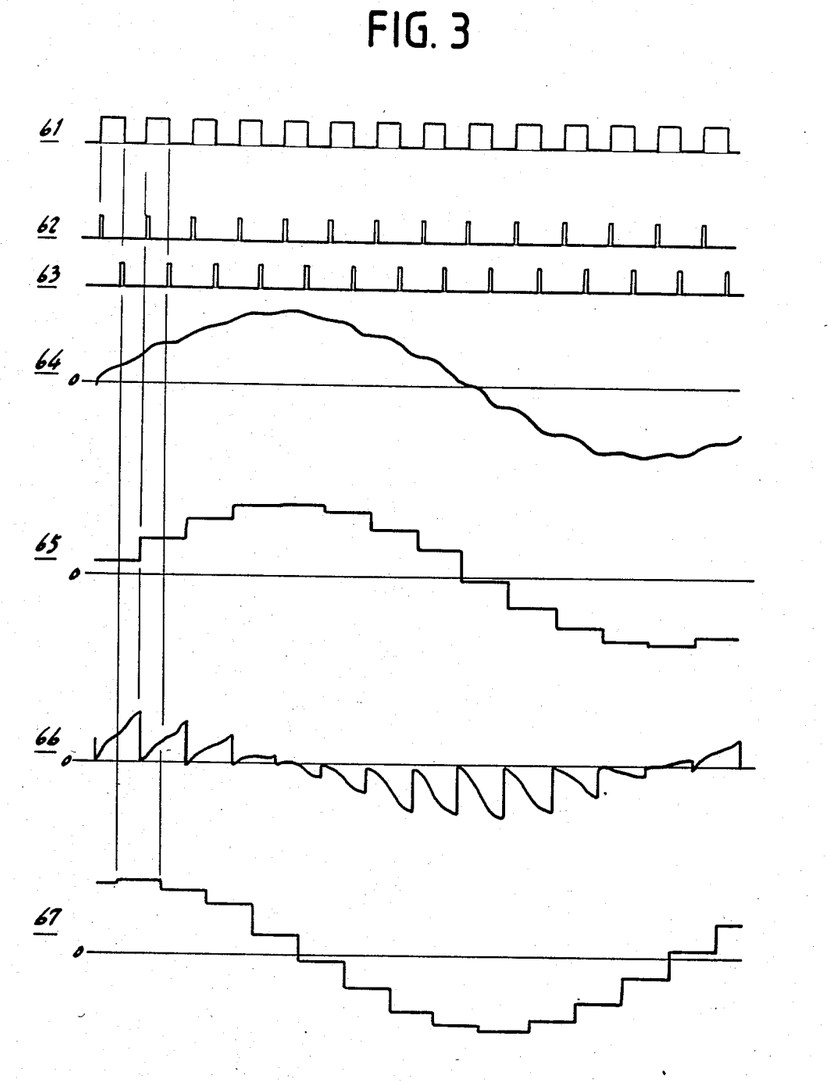
FIG. 3 is a waveform diagram associated with the first embodiment.

Referring to FIG. 3, illustrated at 61 is the waveform of the true output of flip-flop 43 of the second sampling pulse generator 40. The waveforms of the sampling pulses from the monostable multivibrators 45 and 46 are shown at 62 and 63, respectively. The waveform shown at 64 represents the output of the buffer amplifier which is exapanded on time scale for purposes of explanation and which corresponds to the waveform 53 of FIG. 2.

The wavefrom 64 is sampled at 38 kHz at which the right- and left-channel signals are separated in the separator circuit 5 and generates a waveform shown at 65 in FIG. 3. The waveforms 64 and 65 are subtracted in the subtractor 33. Since the sampled value at the negative input of subtractor 33 represents the amplitude of the waveform 64 one sampling period earlier than instantaneous value of the waveform 64 at the positive ihput of the subtractor, the output of this subtractor, which is shown at 66, represents the slope ratio of the FM signal. The slope ratio signal 66 is then sampled by the sample-and-hold circuit 31 at a point 180° displaced from the sampling point at which the waveform 64 is first sampled, thus deriving a waveform 67 from intermediate points of the differential signal 66. Due to the differential action, the waveform 67 is 90° out of phase with respect to the waveform 64.

The waveform 67 is applied to the sample-and-hold circuit 32 where it is sampled in response to the noise-triggered sampling pulse 52, so that the output of sample-and-hold 32 will be held during the noise-affected period at a potential which is proportional to the gradient of the noise-affected portion of the signal as shown at 54 in FIG. 2.

Since the sample-and-hold circuit 12 retains the amplitude of the FM signal just prior to the occurrence of the noise, the voltage sampled by the sample-and-hold circuit 32 represents the slope ratio by which the noise-affected portion of the FM signal is to be compensated.

The constant-current charge-discharge circuit 15 responds to the output of sample-and-hold 32 by linearly discharging the capacitor 14 at different rates in the case of noises N1 and N2 since they occur on downhill portions of the signal having different slope ratios and charging that capacitor in the case of noise N2 at a highest rate since it occurs on an uphill slope having a maximum slope ratio. Therefore, the noise-affected portions of the FM signal are linearly interpolated as indicated at $53_1$, $53_2$ and $53_3$ in FIG. 2.

While in the embodiment described above, the 38-kHz sampling pulses are derived from the pilot signal of the received FM signal, it is possible to derive it from a pulse generator independent of the pilot signal.

Figure 4:
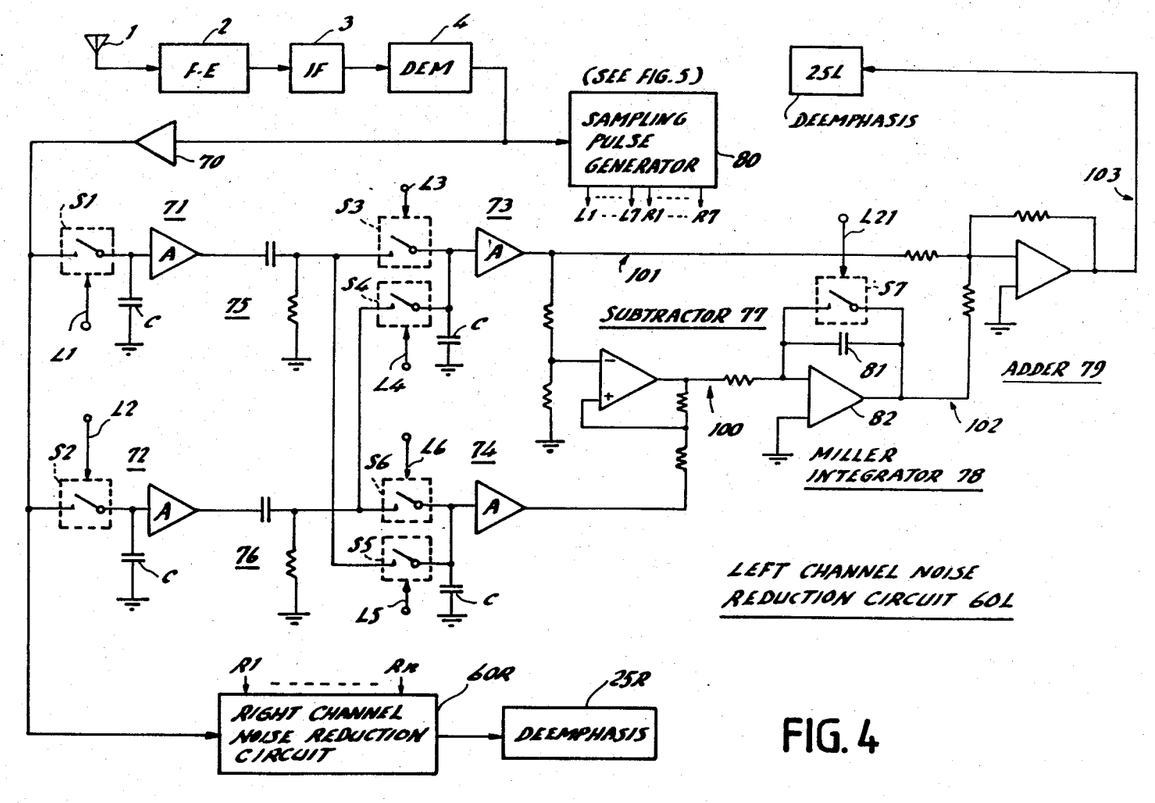
FIG. 4 is a block diagram of a second embodiment of the present invention.

FIG. 4 is an illustration of a second embodiment of the present invention in which parts corresponding to those of FIG. 1 are marked with the same numerals as in FIG. 1.

The left-channel noise reduction circuit 60L of the second embodiment generally comprises sample-andhold circuits 71, 72, 73 and 74, DC decoupling networks 75 and 76 connected between these sample-and-hold circuits, a subtractor 77, a Miller integrator 78 and an adder 79. The sample-and-hold circuits 71, 72 include electronic switches S1 and S2 respectively responsive to sampling pulses L1 and L2. Sample-and-hold 73 includes a pair of switches S3 and S4 which are responsive to sampling pulses L3 and L4, respectively, and sample-and-hold 74 includes a pair of switches S5 and S6 respectively responsive to sampling pulses L5 and L6. The sampling pulses L1 to L6 occur at 19 kHz with phase differences therebetween as will be discussed below.

The output of sample-and-hold 71 is coupled to sample-and-hold 73 in response to sampling pulse L3 and cross-coupled to sample-and-hold 74 in response to sampling pulse S5. The output of sample-and-hold 72 is coupled to sample-and-hold 74 in response to sampling pulse L6 and cross-coupled to sample-and-hold 73 in response to sampling pulse L4. The outputs of sample-and-holds 73 and 74 are connected to the negative and positive inputs of subtractor 77, respectively. The DC decoupling networks 75 and 76 block DC signals which are generated in sample-and-holds 71 and 72 as a result of the coincidence between the 19-kHz sampling frequency and the 19-kHz pilot signal transmitted with the signals applied to the sample-and-holds 71 and 72 through an amplifier 70 from the demodulator 4, while admitting the high-frequency components to the sample-and-holds 73 and 74.

Figure 5:
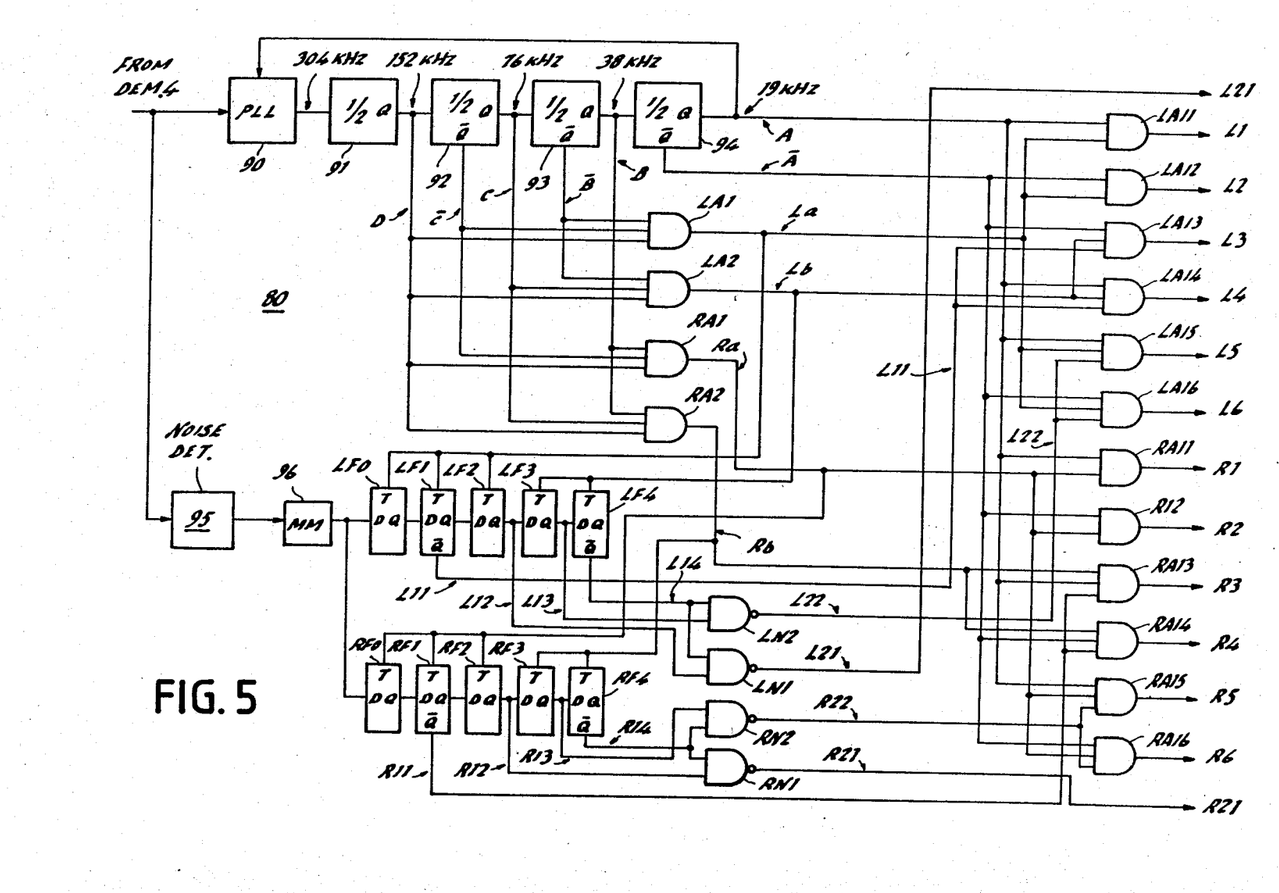
FIG. 5 is a block diagram of the sampling pulse generator of FIG. 4.

Referring to FIG. 5 in which the sampling pulse generator 80 is illustrated in detail. The output signal from the demodulator 4 is applied to a phase-locked loop 90 whose output is connected to a frequency divider comprising a series of flip-flops 91 to 94, the output of flip-flop 94 being a 19 kHz signal which is fed back to the phase-locked loop 90. Signals at frequencies 304 kHz, 152 kHz, 76 kHz and 38 kHz are generated respectively at the inputs to the flip-flops 91–94. The waveforms of the outputs of flip-flops 94, 93, 92 and 91 are shown at A, B, C and D, respectively, in FIG. 6.

The output signals B, C, D and the complementary outputs B, C are applied to a pair of left-channel three-input AND gates LA1 and LA2 and a pair of right-channel three-input AND gates RA1 and RA2. The first inputs of the left-channel AND gates LA1 and LA2 are connected together to the complementary output of flip-flop 93 and the third inputs of these AND gates are connected together to the true output of flip-flop 92, and the second inputs of these AND gates are coupled respectively to the complementary and true outputs of flip-flop 92. The waveforms of the outputs of left-channel AND gates LA1 and LA2 are shown at La and Lb in FIG. 6.

In a similar manner, the right-channel AND gates RA1 and RA2 have their first inputs coupled together to the true output of flip-flop 93 and their third inputs coupled together to the true output of flip-flop 91. However, their second inputs are connected respectively to the complementary and true outputs of flip-flop 92. The waveforms of pulses delivered from AND gates RA1 and RA2 are shown at Ra and Rb, respectively, in FIG. 6. It is seen that the pulses La, Lb, Ra and Rb occur at 38 kHz with a phase difference of 90° between them.

The output signal from the demodulator 4 is also applied to an impulse noise detector 95 which is identical to the noise detector 8 of the previous embodiment. In response to the output of noise detector 95, a monostable multivibrator 96 generates a pulse N having a duration (typically, 60 microseconds) somewhat longer than the duration of the detected noise burst (which is assumed to exist between time $T_0$ to Ta, FIG. 6).

Figure 6:
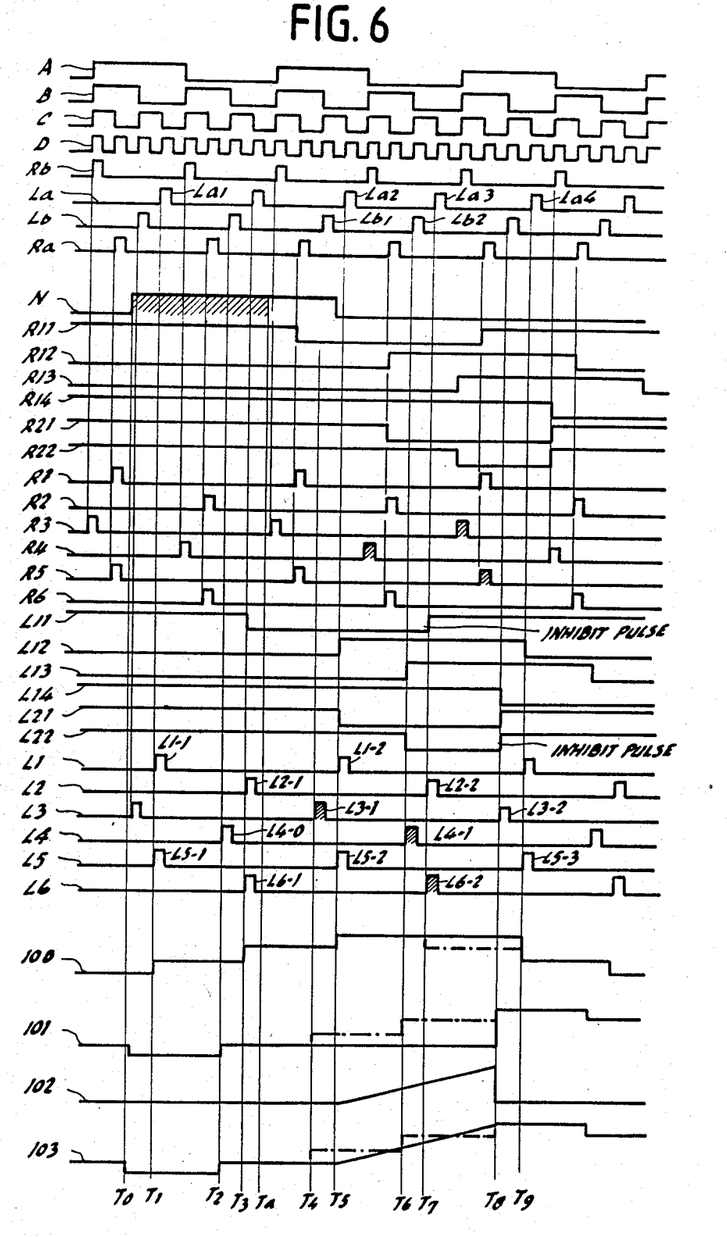
FIG. 6 is a waveform diagram associated with the block diagrams of FIGS. 4 and 5.

The output of the monostable multivibrator 96 is applied to a left-channel D-type flip-flop stage comprising flip-flops LF0 through LF4 and to a right-channel flip-flop stage comprising D-type flip-flops RF0 through RF4. Pulse La is applied to the trigger inputs of flip-flops LF0–LF2 and pulse Lb is applied to the trigger inputs of flip-flops LF3 and LF4. Negative- and positive-going pulses L11 and L12 of the duration twice as large as the interval between successive trigger pulses La are generated by the flip-flops LF1 and LF2 and positive- and negative-going pulses L13 and L14 of the duration twice as large as the interval between successive pulses Lb are generated by flip-flops LF3 and LF4, as illustrated in FIG. 6. The pulses L12 and L14 are combined in a left-channel NAND gate LN1 to produce a negative-going pulse L21 and the pulses L13 and L14 are combined in a left-channel NAND gate LN2 to produce a negative-going pulse L22.

Likewise, pulse Ra is applied to the trigger inputs of flip-flops RF1 to RF3 and pulse Rb is applied to the trigger inputs of flip-flops RF4 and RF5. Negative- and positive-going pulses R11 and R12 of the duration twice as large as the interval between successive trigger pulses Ra are generated by the flip-flops RF1 and RF2 and positive- and negative-going pulses R13 and R14 of the duration twice as large as the interval between successive pulses Rb are generated by flip-flops RF3 and RF4, as illustrated in FIG. 6. The pulses R12 and R14 are combined in a right-channel NAND gate RN1 to produce a negative-going pulse R21 and the pulses R13 and R14 are combined in a right-channel NAND gate RN2 to produce a negative-going pulse R22.

Pulse A from flip-flop 94 is applied to left-channel AND gates LA11, LA14 and LA15 and the complementary of this pulse is applied to left-channel AND gates LA12, LA13 and LA16. Pulse La is applied to left-channel AND gates LA11 and LA12 to produce the sampling pulses L1 and L2 for application to the sample-and-hold circuits 71 and 72, respectively. Pulse La is further applied to left-channel AND gates LA15 and LA16 to produce the sampling pulses L5 and L6 which are applied to the sample-and-hold circuit 74. One of the sampling pulses L5 and L6 is inhibited by inhibit pulse L22 from left-channel NAND gate LN2 depending on the time of occurrence of this inhibit pulse in relation to the sampling pulse L5 and L6. Pulse Lb is applied to left-channel AND gates LA13 and LA14 to produce the sampling pulses L3 and L4 for application to the sample-and-hold circuit 73. Sampling pulses L3 and L4 are inhibited by negative-going pulse L11 from flip-flop LF1. The output of the NAND gate LN1 is coupled to the switch S7 of the Miller integrator 78. Switch S7 is normally closed to pass the output of subtractor 77 to the adder 79 and opens in response to the negative-going pulse L21 to enable the Miller integrator to effect linear integration on the differential output from the subtractor 77.

In like manner, pulse A is applied to right-channel AND gates RA11, RA14 and RA15 and the complementary of which is applied to right-channel AND gates RA12, RA14 and RA16. Pulse Ra is applied to right-channel AND gates RA11 and RA12 to produce sampling pulses R1 and R2 for application to the sampleand-hold circuits of the right-channel noise reduction circuit which correspond to the sample-and-hold circuits 71 and 72 of the left-channel. Pulse Ra is further applied to right-channel AND gates RA15 and RA16 to produce sampling pulses R5 and R6 which are applied to the sample-and-hold circuit which corresponds to the left-channel sample-and-hold 74. One of the sampling pulses R5 and R6 is inhibited by negative-going pulse R22 from right-channel NAND gate RN2 depending on the time of occurrence of this inhibit pulse in relation to the pulses R5 and R6. Pulse Rb is applied to right-channel AND gates RA13 and RA14 to produce sampling pulses R3 and R4 for application to the sample-and-hold circuit corresponding to the left-channel sample-and-hold 73. The sampling pulses R3 and R4 are inhibited by negative-going pulse R11 from flip-flop RF1. The output of NAND gate RN1 has the same function as that of the output of left-channel NAND gate LN1.

As is seen in FIG. 6, sampling pulse L1 and L2 occur at 19 kHz with a phase difference of 90° therebetween and are alternately time-coincident with pulses La. Sampling pulses L5 and L6 occur in coincidence with sampling pulses L1 and L2, respectively. While sampling pulses L3 and L4 occur at 19 kHz with a phase difference of 90° therebetween, these sampling pulses being alternately time-coincident with pulses Lb. All the sampling pulses L1 through L6 are 90° phase-shifted with respect to the sampling pulses R1 through R6, respectively.

The operation of the noise reduction circuit of FIG. 4 will be now be described with reference to FIG. 6.

In the absence of impulse noise, the logical level at the D input of flip-flop LF0 remains low, the complementary outputs of flip-flops LF1 and LF4 are high and the true outputs of flip-flops LF2 and LF3 are low. This conditions the sampling pulse generator 80 to generate sampling pulses L1 to L6 continuously.

The sterephonic FM signal applied to sample-and-holds 71 and 72 is alternately sampled in response to pulses L1-1 and L2-1 at times $T_1$ and $T_3$ and stored until the next sampling pulses L1-2 and L2-2 occur at times $T_5$ and $T_7$, respectively. Because of the 90° phase difference between sampling pulses L1 and R1 and the same phase difference between sampling pulses L2 and R2, the signals stored on sample-and-holds 71 and 72 represent the components of the left-channel signal, and the signals stored on the corresponding sample-and-holds of the right-channel noise reduction circuit represent the components of the right-channel signal.

With regard to the sample value stored in the sample-and-hold 73, the signal sampled by pulse L1-1 is first transferred thereto from sample-and-hold 71 in response to a sampling pulse L3-1 at time $T_4$ and stored therein until time $T_6$ at which it is refreshed by the signal which was sampled by pulse L2-1 and is transferred from sample-and-hold 72. The refreshed signal is retained until time $T_8$ at which it is refreshed again by the signal which was sampled at $T_5$ in response to a sampling pulse L1-2 and is transferred from sample-and-hold 71. Therefore, the signals sampled alternately at 19 kHz by sample-and-holds 71 and 72 appear alternately at 38 kHz at the output of sample-and-hold 73.

Regarding the sample value stored in the sample-and-hold 74, the signal sampled by pulse L1-1 at time $T_1$ is simultaneously transferred thereto from sample-and-hold 71 in response to a sampling pulse L5-1 and is refreshed by the signal which is sampled at time $T_3$ in response to pulse L2-1 and simultaneously transferred thereto from sample-and-hold 72 in response to a sampling pulse L6-1. At times $T_5$ and $T_7$, the stored signal is refreshed by the outputs of sample-and-holds 71 and 72 in succession which are simultaneously sampled in response to sampling pulses L1-2 and L2-2 and transferred thereto in response to sampling pulses L5-2 and L6-2, respectively. Therefore, the signals sampled alternately by sample-and-holds 71 and 72 at 19 kHz appear alternately at 38 kHz at the output of sample-and-hold 74.

However, due to the time-coincidence between sampling pulses L1, L2 and sampling pulses L5 and L6, the signal stored in sample-and-hold 74 represents the signal which was sampled one sample period later than the signal stored in sample-and-hold 73.

In response to the presence of an impulse noise during the period $T_0$ to Ta, a positive-going pulse N, typically of a 60-microsecond duration, is generated by the monostable multivibrator 96 and the complementary output of flip-flop LF1 goes low at time $T_3$ in response to a pulse La$_1$, generating an inhibit pulse L11 which lasts for a duration twice the interval between successive pulses La until the flip-flop LF1 goes high in response to a pulse La$_3$ at time $T_7$. The true outputs of flip-flops LF2 and LF3 switch to high level in response to pulses La$_2$ and Lb$_1$ at times $T_5$ and $T_6$, respectively, and the complementary output of flip-flop LF4 goes low in response to a pulse Lb$_2$ at time $T_8$. Inhibit pulse L22 is generated which lasts for a duration from time $T_6$ to time $T_8$. The sampling pulses L3-1, L4-1 and L6-2 are inhibited, while the sampling pulse L5-2 remains unaffected. As a result, the signal which is stored in sample-and-hold 73 during the time prior to time $T_4$ is not refreshed in response to the pulses L3-1 and L4-1 and retained until time $T_8$. On the other hand, the signal which occurs immediately following the noise is sampled in response to pulse L1-2 and simultaneously transferred to sample-and-hold 74 in response to the sampling pulse L5-2 and retained therein until time T9.

Therefore, the signal stored in sample-and-hold 73 during the period from $T_4$ to $T^8$ represents the sample value that occurs immediately prior to the occurrence of the noise, while the signal stored in sample-and-hold 74 during the period from $T_5$ to $T_9$ represents the sample value that occurs immediately after the occurrence of the noise. During the period from $T_5$ to $T_8$ the output of subtractor 77 indicates the difference between the samples obtained immediately before and after the occurrence of the noise, and hence the slope ratio of the signal at the instant immediately prior to the occurrence of the noise.

During the period from $T_5$ to $T_8$, the NAND gate LN1 switches to a low level producing a negative-going pulse L21 which is applied to the switch S7 in the Miller integrator 78 to allow it to integrate the slope ratio signal, producing a linearly increasing voltage.

The waveforms shown at 100–103 represent the output signals of subtractor 77, sample-and-hold 73, Miller integrator 78 and adder 79, respectively. These waveforms follow the solid-line curves in the presence of the noise and follow the chain-dot line in the absence of the noise. The period from $T_5$ to $T_8$, which would otherwise be affected by the noise introduced during the period from $T_0$ to Ta, is thus linearly interpolated.

Assume that an impulse noise occurs so that the falling edge of the inhibit pulse L11 coincides with time $T_1$, sampling pulses L4-0, L3-1 and L5-2 will be inhibited. In that event, the sample-and-hold will retain a first voltage which is sampled during the time prior to pulse L4-0, while the sample-and-hold 74 will hold a second voltage which is sampled in response to pulse L2-1 and simultaneously transferred thereto in response to pulse L6-1. The first and second voltages represent the sample values obtained respectively at the instants immediately before and after the occurrence of the noise. Linear integration will be effected during the period from $T_3$ to $T_6$.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. A noise reduction circuit for use with an FM receiver adapted to receive a composite stereophonic FM signal comprising a sum of left and right channel signals on a main channel, a difference between left and right channel signals on a subcarrier channel, a pilot signal and the sidebands of a suppressed subcarrier which is twice the frequency of said pilot signal and modulated by said difference, said receiver including a demodulator for demodulating said composite FM signal, comprising:

noise detecting means for detecting an impulse noise in the demodulated signal;

first means responsive to the output of said noise detecting means for sampling said demodulated signal immediately prior to the occurrence of said noise;

second means for sampling said demodulated signal at a frequency twice the frequency of said pilot signal;

third means responsive to the outputs of said first and second means for generating a signal representing the slope ratio of said demodulated signal sampled by said first means; and fourth means for linearly integrating said slope ratio signal to generate a linearly varying signal and combining same with the demodulated signal sampled by said first means.

2. A noise reduction circuit for use with an FM receiver adapted to receive a stereophonic composite FM signal for suppressing an impulse noise contained in a signal demodulated by a demodulator of said receiver, said FM signal comprising a sum of left and right channel signals on a main channel, a difference between left and right channel signals on a subcarrier channel, a pilot signal and the sidebands of a suppressed subcarrier which is twice the frequency of said pilot signal and modulated by said difference, said receiver including means for separating the demodulated signal into left and right channel signals in response to said pilot signal, comprising:

first sampling pulse generating means for generating a first sampling pulse in response to said impulse noise;

second sampling pulse generating means for generating a pair of trains of second and third sampling pulses at a frequency twice the frequency of said pilot signal, there being a predetermined phase difference between said second and third sampling pulses;

first sample-and-hold means for tracking the waveform of one of the separated left and right channel signals for application to an output terminal and operating in a sample-and-hold mode in response to said first sampling pulse for sampling a voltage which occurs immediately prior to the occurrence of said noise for application to said output terminal;

second sample-and-hold means connected to the output of said first sample-and-hold means for operating in a sample-and-hold mode in response to said second sampling pulse;

subtracting means for generating a signal representing the difference between the outputs of said first and second sample-and-hold means;

third sample-and-hold means connected to the output of said difference signal generating means for operating in a sample-and-hold mode in response to said third sampling pulse;

fourth sample-and-hold means connected to the output of said third sample-and-hold means for operating in a sample-and-hold mode in response to said first sampling pulse to generate a signal indicating the slope ratio of said one channel signal at the time said voltage is sampled; and charge-and-discharge means for linearly increasing and decreasing said voltage at a rate variable as a function of the output of said fourth sample-and-hold means.

3. A noise reduction circuit as claimed in claim 2, wherein said predetermined phase difference is 180 degrees.

4. A noise reduction circuit as claimed in claim 2, wherein said second sampling pulse generating means comprises a phase-locked loop having a first input responsive to said pilot signal and a second input for phase comparison with the signal at said first input and generating an output frequency signal responsive to the difference in phase between the signals at said first and second inputs, and means for dividing the output frequency at successive stages for generating said second and third sampling pulses and applying a divided frequency signal to said second input.

5. A noise reduction circuit as claimed in claim 2, wherein said charge-and-discharge means comprises a pair of transistors of opposite conductivity types connected in a series circuit between voltage supplies of opposite polarities, and a resistor network for biasing said transistors in response to the output signal from said fourth sample-and-hold means, a junction between said transistors being coupled to a capacitor of said first sample-and-hold means.

6. A noise reduction circuit as claimed in claim 2, wherein said charge-and-discharge means comprises a first buffer amplifier having a high output impedance connected between said demodulator and said first sample-and-hold means and a second buffer amplifier having a high input impedance connected in series with said first buffer amplifier between said first sample-and-hold means and said output terminal.

7. A noise reduction circuit for use with an FM receiver adapted to receive a composite stereophonic FM signal comprising a sum of left and right channel signals on a main channel, a difference between left and right channel signals on a subcarrier channel, a pilot signal and the sidebands of a suppressed subcarrier which is twice the frequency of said pilot signal and modulated by said difference, said receiver including a demodulator for demodulating said composite FM signal, comprising:

first means for sampling said demodulated signal at a frequency twice the frequency of said pilot signal;

noise detecting means for detecting an impulse noise in the demodulated signal;

second means responsive to the output of said noise detecting means for sampling the output of said first means immediately prior to the occurrence of said noise;

third means responsive to the output of said noise detecting means for sampling the output of said first means immediately following the termination of said noise;

fourth means for detecting a difference between the outputs of said second and third means;

fifth means for linearly integrating said difference to generate a linearly varying signal; and sixth means for combining said linearly varying signal with the output of said second means.

8. A noise reduction circuit for use with an FM receiver adapted to receive a stereophonic composite FM signal for suppressing an impulse noise contained in a signal demodulated by a demodulator of said receiver, said FM signal comprising a sum of left and right channel signals on a main channel, a difference between left and right channel signals on a subcarrier channel, a pilot signal and the sidebands of a suppressed subcarrier which is twice the frequency of said pilot signal and modulated by said difference, comprising:

sampling pulse generating means connected to the output of said demodulator for generating first, second, third, fourth, fifth and sixth sampling pulses, said first and second sampling pulses occurring at the frequency of said pilot signal with a phase difference of 180 degrees therebetween, said third and fourth sampling pulses occurring at the pilot signal frequency with a phase difference of 180 degrees therebetween and a predetermined phase shift with respect to said first and second sampling pulses respectively, and said fifth and sixth sampling pulses occurring in synchronism with said first and second sampling pulses respectively;

a pair of first and second sample-and-hold means each being responsive to said demodulated signal for operating in a sample-and-hold mode in response to said first and second sampling pulses, respectively;

a pair of first and second DC decouplers;

third sample-and-hold means for operating in a first sample-and-hold mode in response to said third sampling pulse for sampling the output of said first sample-and-hold means through said first DC decoupler and operating in a second sample-and-hold mode in response to said fourth sampling pulse for sampling the output of said second sample-and-hold means through said second DC decoupler;

fourth sample-and-hold means for operating in a first sample-and-hold mode in response to said fifth sampling pulse for sampling the output of said first sample-and-hold means through said first DC decoupler and operating in a second sample-and-hold mode in response to said sixth sampling pulse for sampling the output of said second sample-and-hold means through said second DC decoupler;

subtracting means for generating a signal representing the difference between the outputs of said third and fourth sample-and-hold means;

summing means for summing the output of said third sample-and-hold means with an input signal applied thereto;

integrating means for normally coupling the output of said subtracting means to said summing means as said input signal when disabled and linearly integrating the output of said subtracting means and coupling the integrated output to said summing means as said input signal when enabled;

noise detecting means connected to the output of said demodulator for detecting an impulse noise;

inhibit pulse generating means for disabling said third and fourth sampling pulses in response to the output of said noise detecting means and one of said fifth and six sampling pulses in response to the output of said noise detecting means depending on the time of occurrence of said noise with respect to the time of occcurrence of said fifth and sixth sampling pulses; and integration enabling means responsive to the output of said noise detecting means for enabling said integrating means from the time of occurrence of the one of said fifth and sixth sampling pulses which is not disabled to the time of occurrence of said third sampling pulse.

9. A noise reduction circuit as claimed in claimed in claim 8, wherein said integrating means comprises a Miller integrator and a switch normally providing a short circuit across an integrating capacitor of said Miller integrator and providing an open circuit in response to an output signal from said integration enabling means.

10. An FM receiver adapted to receive a composite stereophonic FM signal comprising a sum of left and right channel signals on a main channel, a difference between left and right channel signals on a subcarrier channel, a pilot signal and the sidebands of a suppressed subcarrier which is twice the frequency of said pilot signal and modulated by said difference, comprising:

a demodulator for demodulating said composite FM signal;

noise detecting means for detecting an impulse noise in said demodulated signal; and a pair of left-channel and right-channel noise reduction circuits each comprising:

first means responsive to the output of said noise detecting means for sampling said demodulated signal immediately prior to the occurrence of said noise;

second means for sampling said demodulated signal at a frequency twice the frequency of said pilot signal;

third means responsive to the outputs of said first and second means for generating a slope signal representing the slope ratio of the demodulated signal sampled by said first means; and fourth means for linearly integrating said slope signal to generate a linearly varying signal and combining same with the demodulated signal sampled by said first means.

11. An FM receiver comprising:

a demodulator for demodulating a stereophonic composite FM signal comprising a sum of left and right channel signals on a main channel, a difference between left and right channel signals on a subcarrier channel, a pilot signal and the sidebands of a suppressed subcarrier which is twice the frequency of said pilot signal and modulated by said difference;

means for separating the demodulated signal into left and right channel signals in response to said pilot signal; and a pair of left-channel and right-channel noise reduction circuits each comprising:
- first sampling pulse generating means for generating a first sampling pulse in response to an impulse noise in said demodulated signal;
- second sampling pulse generating means connected to the output of said demodulator for generating a pair of trains of second and third sampling pulses at a frequency twice the frequency of said pilot signal, there being a predetermined phase difference between said second and third sampling pulses;
- first sample-and-hold means for tracking the waveform of one of the separated left and right channel signals for application to a deemphasis circuit and operating in a sample-and-hold mode in response to said first sampling pulse for sampling a voltage which occurs immediately prior to the occurrence of said noise for application to said deemphasis circuit;
- second sample-and-hold means connected to the output of said first sample-and-hold means for operating in a sample-and-hold mode in response to said second sampling pulse;
- subtracting means for generating a signal representing the difference between the outputs of said first and second sample-and-hold means;
- third sample-and-hold means connected to the output of said difference signal generating means for operating in a sample-and-hold mode in response to said third sampling pulse;
- fourth sample-and-hold means connected to the output of said third sample-and-hold means for operating in a sample-and-hold mode in response to said first sampling pulse to generate a signal representing the slope ratio of said one channel signal at the time said voltage is sampled by said first sample-and-hold means; and
- charge-and-discharge means for linearly increasing and decreasing said voltage at a rate variable as a function of the output of said fourth sample-and-hold means.

12. An FM receiver as claimed in claim 11, wherein said predetermined phase difference is 180 degrees.

13. An FM receiver as claimed in claim 11, wherein said second sampling pulse generator comprises a phase-locked loop having a first input responsive to said pilot signal and a second input for phase comparison with the signal at said first input and generating an output frequency signal responsive to the difference in phase between the signals at said first and second inputs, and means for dividing the output frequency at successive stages for generating said second and third sampling pulses and applying a divided frequency signal to said second input.

14. An FM receiver as claimed in claim 11, wherein said charge-and-discharge means comprises a pair of transistors of opposite conductivity types connected in a series circuit between voltage supplies of opposite polarities, and a resistor network for biasing said transistors in response to the output signal from said fourth sample-and-hold means, a junction between said transistors being coupled to a capacitor of said first sample-and-hold means.

15. An FM receiver as claimed in claim 11, wherein said charge-and-discharge means comprises a first buffer amplifier having a high output impedance connected between said demodulator and said first sample-and-hold means and a second buffer amplifier having a high input impedance connected in series with said first buffer amplifier between said first sample-and-hold means and said output terminal.

16. An FM receiver comprising:
- a demodulator for demodulating a composite stereophonic FM signal comprising a sum of left and right channel signals on a main channel, a difference between left and right channel signals on a subcarrier channel, a pilot signal and the sidebands of a suppressed subcarrier which is twice the frequency of said pilot signal and modulated by said difference;
- a pair of left-channel and right-channel noise reduction circuits each comprising:
  - first means for sampling said demodulated signal at a frequency twice the frequency of said pilot signal;
  - noise detecting means for detecting an impulse noise in said demodulated signal;
  - second means responsive to the output of said noise detecting means for sampling the output of said first means immediately prior to the occurrence of said noise;
  - third means responsive to the output of said noise detecting means for sampling the output of said first means immediately following the termination of said noise;
  - fourth means for detecting a difference between the outputs of said second and third means;
  - fifth means for linearly integrating said difference to generate a linearly varying signal; and
  - sixth means for combining said linearly varying signal with the output of said second means.

17. An FM receiver comprising:
- a demodulator for demodulating a stereophonic composite FM signal comprising a sum of left and right channel signals on a main channel, a difference between left and right channel signals on a subcarrier channel, a pilot signal and the sidebands of a suppressed subcarrier which is twice the frequency of said pilot signal and modulated by said difference;
- sampling pulse generating means connected to the output of said demodulator for generating first and second sets of first, second, third, fourth, fifth and sixth sampling pulses, said first and second sampling pulses of each set occurring at the frequency of said pilot signal with a phase difference of 180 degrees therebetween, said third and fourth sampling pulses of each set occurring at the pilot signal frequency with a phase difference of 180 degrees therebetween and a predetermined phase shift with respect to said first and second sampling pulses respectively, and said fifth and sixth sampling pulses of each set occurring in synchronism with said first and second sampling pulses respectively, the first, second, third, fourth, fifth and sixth sampling pulses of each set having a phase difference of 90 degrees with respect to those of the other set;
- noise detecting means connected to the output of said demodulator for detecting an impulse noise;
- inhibit pulse generating means for disabling said third and fourth sampling pulses of each set in response to the output of said noise detecting means and one of said fifth and six sampling pulses of each set in response to the output of said noise detecting means depending on the time of occurrence of said noise with respect to the time of occcurrence of said fifth and sixth sampling pulses of each set; and a pair of left-channel and right-channel noise reduction circuits responsive to the sampling pulses of said first and second sets, respectively, each of said noise reduction circuits comprising:

a pair of first and second sample-and-hold means each being responsive to said demodulated signal for operating in a sample-and-hold mode in response to said first and second sampling pulses respectively;

a pair of first and second DC decouplers;

third sample-and-hold means for operating in a first sample-and-hold mode in response to said third sampling pulse for sampling the output of said first sample-and-hold means through said first DC decoupler and operating in a second sample-and-hold mode in response to said fourth sampling pulse for sampling the output of said second sample-and-hold means through said second DC decoupler;

fourth sample-and-hold means for operating in a first sample-and-hold mode in response to said fifth sampling pulse for sampling the output of said first sample-and-hold means through said first DC decoupler and operating in a second sample-and-hold mode in response to said sixth sampling pulse for sampling the output of said second sample-and-hold means through said second DC decoupler;

subtracting means for generating a signal representing the difference between the outputs of said third and fourth sample-and-hold means;

summing means for summing the output of said third sample-and-hold means with an input signal applied thereto and applying a summed output to a deemphasis circuit;

integrating means for normally coupling the output of said subtracting means to said summing means as said input signal when disabled and linearly integrating the output of said subtracting means and coupling the integrated output to said summing means as said input signal when enabled; and integration enabling means responsive to the output of said noise detecting means for enabling said integrating means from the time of occurrence of the one of said fifth and sixth sampling pulses which is not disabled to the time of occurrence of said third sampling pulse.

18. An FM receiver as claimed in claimed in claim 17, wherein said integrating means comprises a Miller integrator and a switch normally providing a short circuit across an integrating capacitor of said Miller integrator and providing an open circuit in response to an output signal from said integration enabling means.

* * * * *